United States Patent [19]

Todokoro et al.

[11] Patent Number: 5,160,884
[45] Date of Patent: Nov. 3, 1992

[54] CHARGED PARTICLE BEAM DEVICE

[75] Inventors: Hideo Todokoro; Hiroyuki Shinada, both of Tokyo; Satoru Fukuhara, Katsuta, all of Japan

[73] Assignee: Hitachi, Ltd., Tokyo, Japan

[21] Appl. No.: 647,423

[22] Filed: Jan. 29, 1991

[30] Foreign Application Priority Data

Feb. 2, 1990 [JP] Japan .................................. 2-21973

[51] Int. Cl.⁵ .......................................... G01R 31/28
[52] U.S. Cl. .................................. 324/158 R; 250/311
[58] Field of Search ................... 324/158 R, 158 D; 250/310, 311

[56] References Cited

U.S. PATENT DOCUMENTS

| 4,220,854 | 9/1980 | Feuerbaum | 324/158 R |
| 4,223,220 | 9/1980 | Feuerbaum | 324/158 R |
| 4,477,775 | 10/1984 | Fazekas | 324/158 R |
| 4,486,660 | 12/1984 | Feuerbaum | 324/158 R |
| 4,885,534 | 12/1989 | Eck et al. | 324/158 R |
| 4,887,031 | 12/1989 | Brust | 324/158 R |

FOREIGN PATENT DOCUMENTS 60-127648 7/1985 Japan .

Primary Examiner—Ernest F. Karlsen
Attorney, Agent, or Firm—Fay, Sharpe, Beall, Fagan, Minnich & McKee

[57] ABSTRACT

A charged particle beam device radiates a primary charged particle beam of pulse form on a surface of a specimen, once in each clock period, in synchronism with a clock signal that determines an operating period of an internal operating signal of the specimen. A secondary electron or a reflected electron is detected after it is emitted from the surface of the specimen when the primary charged particle beam of pulse form is irradiated. Each detected signal pulse which is generated from the detecting means once in each period of said clock is sampled at two or more positions in a range including the peak value, and data which correspond to the sum or the averaged value calculated from the sampling values of a plurality of the positions are formed. An internal operating signal waveform of said specimen is displayed by using the data, and therefore the internal operating signal waveform of the specimen can be observed and measured with high measuring accuracy and with high efficiency.

28 Claims, 4 Drawing Sheets

CHARGED PARTICLE BEAM DEVICE

BACKGROUND OF THE INVENTION

This invention relates to an improvement of the technology to measure an internal signal waveform of a semiconductor device by using a beam of charged particles, and more particularly to an improvement of a charged particle beam device suitable for measuring an internal signal waveform of a semiconductor device which deals with logic signals.

In the Japanese Patent Laid-Open No. 60-127648, there is described a method to measure effectively a logic signal waveform in a semiconductor logic device by using an electron beam. A method of irradiating two or more times (n times) a primary electron beam of pulse form within a period (a logical period) of a logic signal that should be measured is described. In this method, the time needed to measure one logic signal waveform can be reduced to 1/n, compared with the conventional method, in which one pulsed electron beam is irradiated within a logic period. Therefore, it is especially advantageous when the logic signal waveform to be measured has a long period (logic period).

However, in the above described patent publication, neither means nor method is found for processing an output signal generated from a secondary electron detector, which detects a secondary electron radiated from the surface of a specimen or a semiconductor device when the above described, pulsed primary electron beam is irradiated.

The present invention relates to a concrete method for processing the above described, secondary electron detecting signal (pulsed signal), and to means for practicing the method, and more particularly to the method and means which become effective when the pulse width and pulse interval of the secondary electron detecting signal pulse are short.

FIG. 4 shows an example of the concrete construction of the measuring device, which irradiates a primary, pulsed electron beam two or more times within one logic period of a logic signal waveform to be measured, and which is disclosed by the above described publication No. 60-127648. In FIG. 4, a primary electron beam 2 radiated from an electron gun 1, is collected by an electronic lens 6 and focused on a specimen 10 to be measured. This collected electron beam 2 is rotated by a scanning coil 8, and is scanned on the specimen 10 to be measured, in the two-dimensional process. When the primary electron beam 2 irradiates the specimen 10, a secondary electron or a reflected electron is emitted from the irradiated position. The secondary electron or the reflected electron is detected by a detector 9, and, by using a detected signal, an image of the specimen (an image of the secondary electron or the reflected electron) is displayed on the screen of a displaying apparatus 7, which is scanned in synchronism with the scanning of the secondary electron beam 2 by using the scanning coil 8. This is the principle of a device which is called a scanning electron microscope.

The scanning electron microscope can also be applied to observe a surface condition of a semiconductor circuit which is being operated, and to measure an operating signal waveform. In this case, an electrostatic deflection plate 3 is supplied with an output pulse signal from a deflection pulse generating circuit 12, which generates pulsed deflection signals synchronizing with a period of operating signals of a semiconductor circuit or a specimen, and thus the primary electron beam 2 is deflected and pulsed. Only when the primary electron beam 2 is deflected to pass through an opening of a perforated plate 4, can it reach the underside of the perforated plate 4; thus, the primary electron beam 2 is pulsed. If the specimen 10 is scanned by using such a pulsed, primary electron beam 2, which irradiates the the specimen 10 only when its constant phase is kept on the specimen 10, a condition of the specimen of different phase can neither be overlapped nor displayed within its periodical change, and therefore only the condition of the specimen of a certain phase point can be selectively displayed within its periodical change.

In order to observe the whole periodical change on the specimen 10 by using the above described method, a changeable delay circuit 5 is inserted between a deflection pulse generating circuit 12 and a driving circuit 11 to drive the specimen (semiconductor circuit), and, by using the changeable delay circuit 5, the timing to generate a deflection pulse signal is made to deflect little by little, comparing to the timing for generating a clock signal to drive the specimen. The specimen to be observed and measured by using the device is preferably a semiconductor integrated circuit (LSI). In this case, based on the timing to generate the clock signal to drive the LSI or specimen, irradiating timing of the pulsed, primary electron beam 2 is determined. And, the timing to generate the pulsed, primary electron beam 2 should be shifted little by little within at least a period (T) of the internal operating signal waveform of LSI. For this purpose, the above described changeable delay circuit 5 is arranged. Therefore, the maximum required delay time ($\tau$) of the changeable delay circuit 5, should at least be equal to a period (T) of the internal operating signal waveform of the specimen (LSI).

When a period (t) of a clock signal to operate the specimen (LSI) coincides with the period (T) of the internal operating signal waveform to be observed and measured, the maximum delay time ($\tau$) of the changeable delay circuit 5 can be equal to the period (t) of the clock signal. However, if the period (T) of the internal operating signal waveform to be observed and measured becomes n times the clock signal period (namely T=n·t), the maximum delay time ($\tau$) of the changeable delay circuit 5 should be n times the clock signal period ($\tau$=T=n·t), too; and therefore the time required to observe and measure the internal operating signal, increases n times.

Thus, in the conventional technology shown in FIG. 4, even if the period (T) of the internal operating signal waveform of the specimen (LSI) to be observed and the measured is n times the clock signal period (t), the pulsed primary electron beam 2 is made to generate once within a period (t) of the clock signal which operates the specimen (LSI), always in synchronism with the clock signal; and then each pulsed primary electron beam is assigned to measure 1/n of the required measuring range (period (T)) of the internal operating signal waveform that should be observed and measured. And, in this measuring system, a gate circuit 18 having n gates G1 to Gn is provided for opening and closing, in synchronism with the delayed clock signal, and for processing a signal detected by the secondary electron (reflected electron) detector 9; and, after the detected signal is passed through each gate, it is stored in memory circuit 23, which has a plurality of memory cells M1 to Mn. That is, the detected signal from the detector 9 is once stored in an individual memory cell by each clock period, and then the stored signal is read out from the memory cells one by one so as to be synthesized as a detected signal for the whole measuring range (period (T)) of the internal operating signal waveform to be observed and measured. The synthesized, detected signal is stored in a memory circuit 24. By using the synthesized, detected signal, the whole of the internal operating signal waveform to be observed and measured can be displayed. By the way, in FIG. 4, numeral 15 represents a control circuit to make open or closed a plurality of gates of the gate circuit 18.

A technical problem of the above described measuring system is a following speed of the gate circuit 18 when the clock frequency becomes high accompanied by the specimen or LSI becoming high speed. When using a clock signal of low frequency, for example 1 MHz or so, for opening and closing one by one a plurality of gates of the gate circuit 18, each detected signal pulse which is taken in by using the gate circuit 18 separately for each clock period, can be integrated by an integrating circuit, and then sampled. However, when the clock frequency becomes high, for example 50 MHz, not only the following speed of the above described integrating circuit but the speed of the gate circuit will have a problem.

As described above, when measuring an internal signal waveform having a clock frequency of 50 MHz in a high speed device by using the conventional technology, it has not been sufficiently considered to process an output signal (pulsed signal) generated from the detector.

SUMMARY OF THE INVENTION

Therefore, an object of the present invention is to supply a signal processing method of a detected output signal (pulsed signal) and a device to practice the method, which can remove the above described problems of the conventional technology.

Another object of the present invention is to improve the accuracy and efficiency for measuring the detected output signal (pulsed signal).

In order to achieve the above described objects, the present invention uses a sampling circuit instead of the conventional integrating circuit as a signal processing circuit of a secondary electron detecting signal pulse. The sampling circuit samples amplitudes of two or more positions including a peak value position of the secondary electron detecting signal pulse, and then, from the sampling values set on two or more positions in the range including the above peak position, their sum or the averaged value is calculated. By using the sum or the averaged value of the sampling values, the internal operating signal waveform of the specimen (LSI) is displayed. In this way, the internal operating signal waveform of the specimen (LSI) which is operated with high speed can be measured in high accuracy and high efficiency.

In order to sample the amplitudes of two or more positions set in the range including the peak value position of the secondary electron detecting signal pulse, an AD converter is operated on two or more positions in the range including the peak value of the secondary electron detecting signal pulse, synchronizing with the period of the secondary electron detecting signal pulse. The timing of sampling by the AD converter is made to coincide with two or more positions in a range set around the periphery which includes the peak value position of the secondary electron detecting signal pulse.

As for the AD converter used here, its response is sufficient for high speed operation, because a converter having an operating speed beyond 100 MHz is commercially available. However, if a sampling value of only one point around the periphery of the peak value of the above described, secondary electron detecting signal pulse, is used as detected signal data, there is the possibility that the S/N ratio of the detected signal data becomes decreased, compared with the conventional integrating method by using an integrating circuit.

Therefore, according to the present invention, values of two or more positions in a range including the peak value of the secondary electron detecting signal pulse are sampled, and the sum or the averaged value of two or more sampling values is used as detected signal data. Thus, the S/N value can be improved as detected signal data. To put it more concretely, a plurality of AD converters are used so as to operate them by shifting their sampling timings by a constant interval for each AD converter, and then the sum or the averaged value is calculated from sampling values of each AD converter.

DESCRIPTION OF PREFERRED EMBODIMENTS

Figure 1:
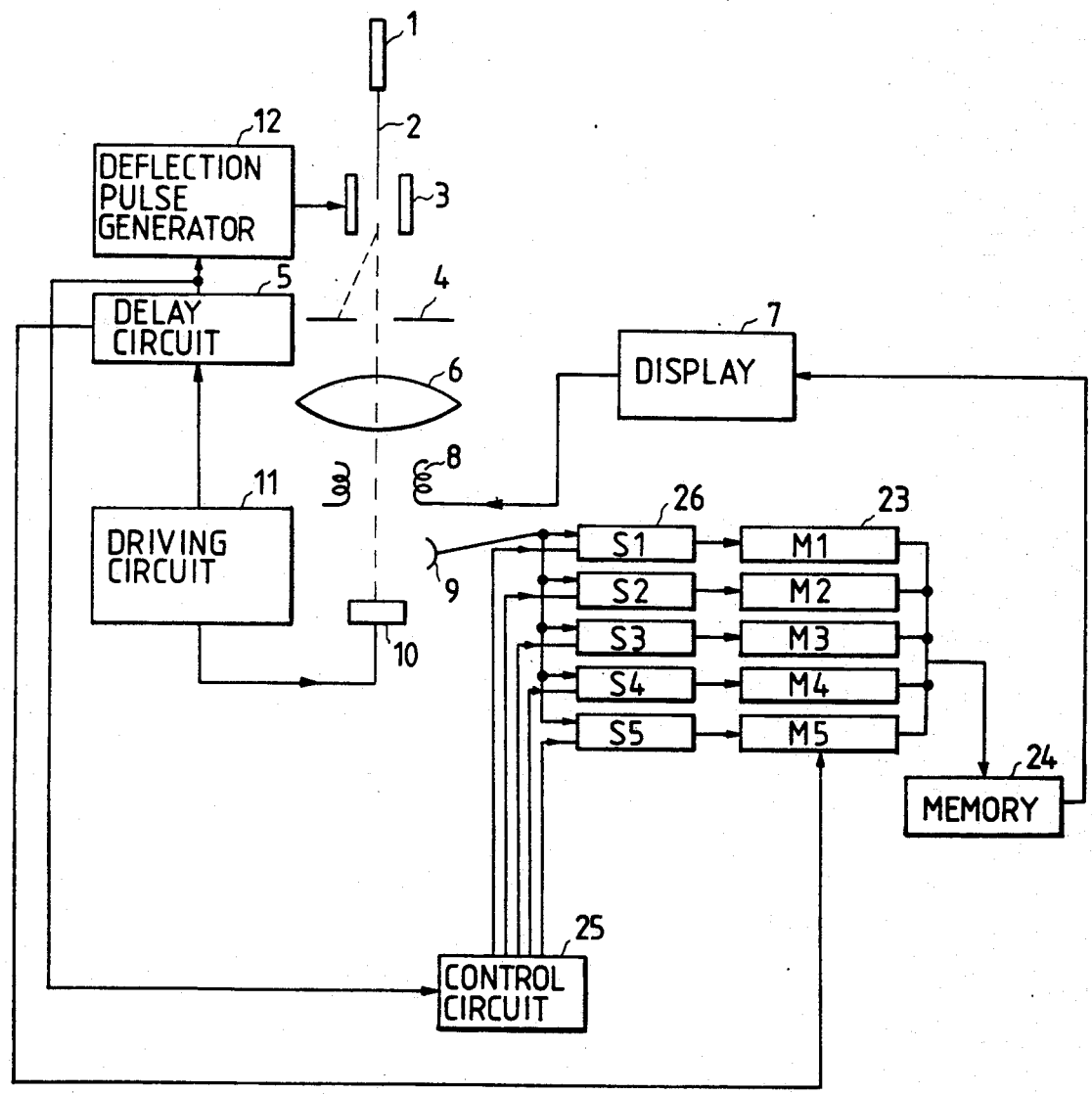
FIG. 1 is a block diagram illustrating a fundamental construction of an embodiment of a charged particle beam device according to the present invention.
Figure 4:
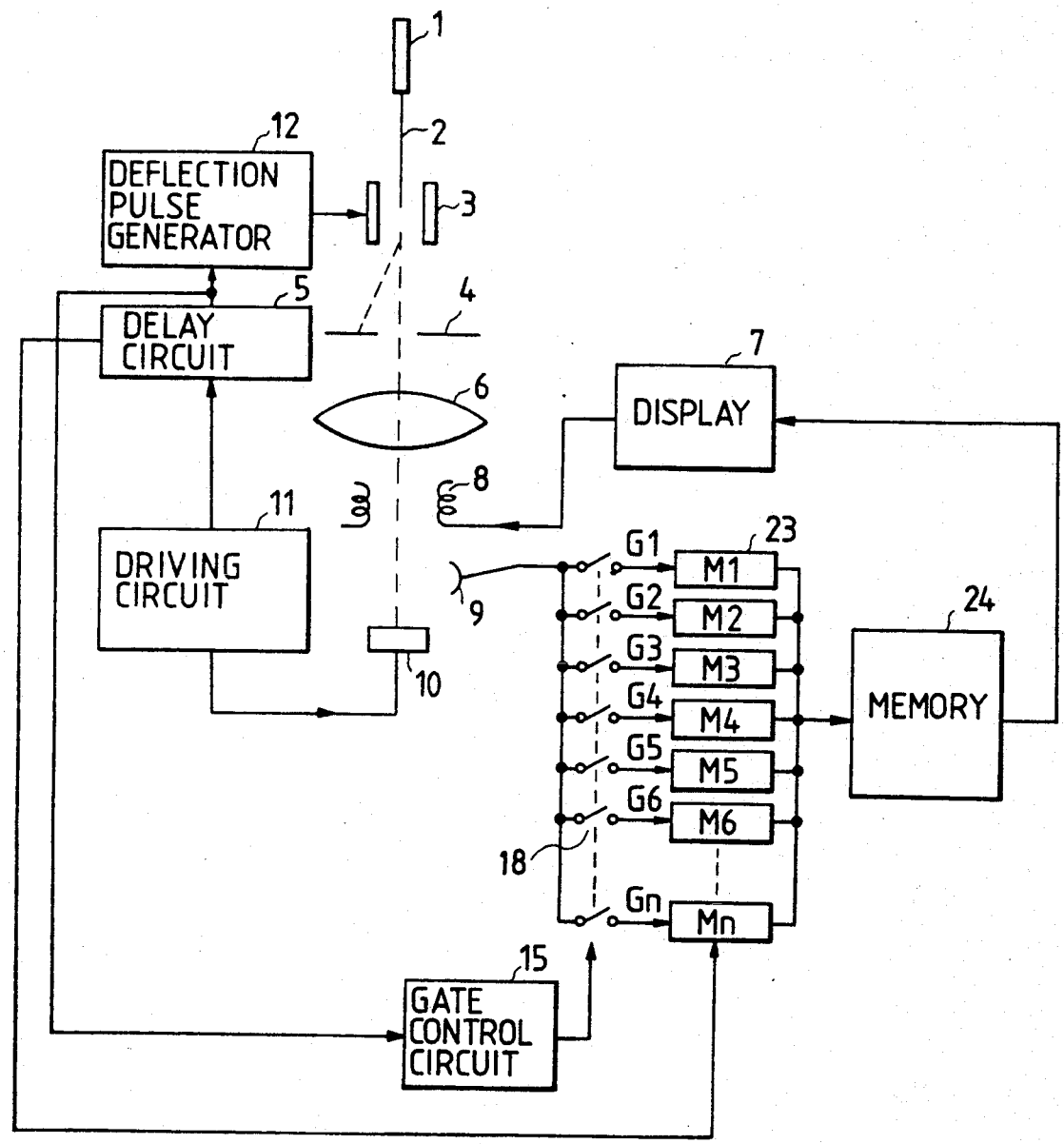
FIG. 4 is a block diagram illustrating the construction of the conventional device.

FIG. 1 shows a fundamental construction of an embodiment of a charged particle beam device according to the present invention. In FIG. 1, the same numerals as used in FIG. 4 refer to the same components, and therefore description of those components is omitted to avoid repetition.

In this embodiment, a sampling device 26 has five sampling circuits S1 to S5 (more concretely, AD converters with high speed response characteristics), and is connected with an output stage of a detector 9. Sampling timing of each sampling circuit of the sampling device 26 is determined by a setting circuit 25. An exemplary sampling operation in which an operating frequency (clock frequency) is 50 MHz will be described.

Figure 2:
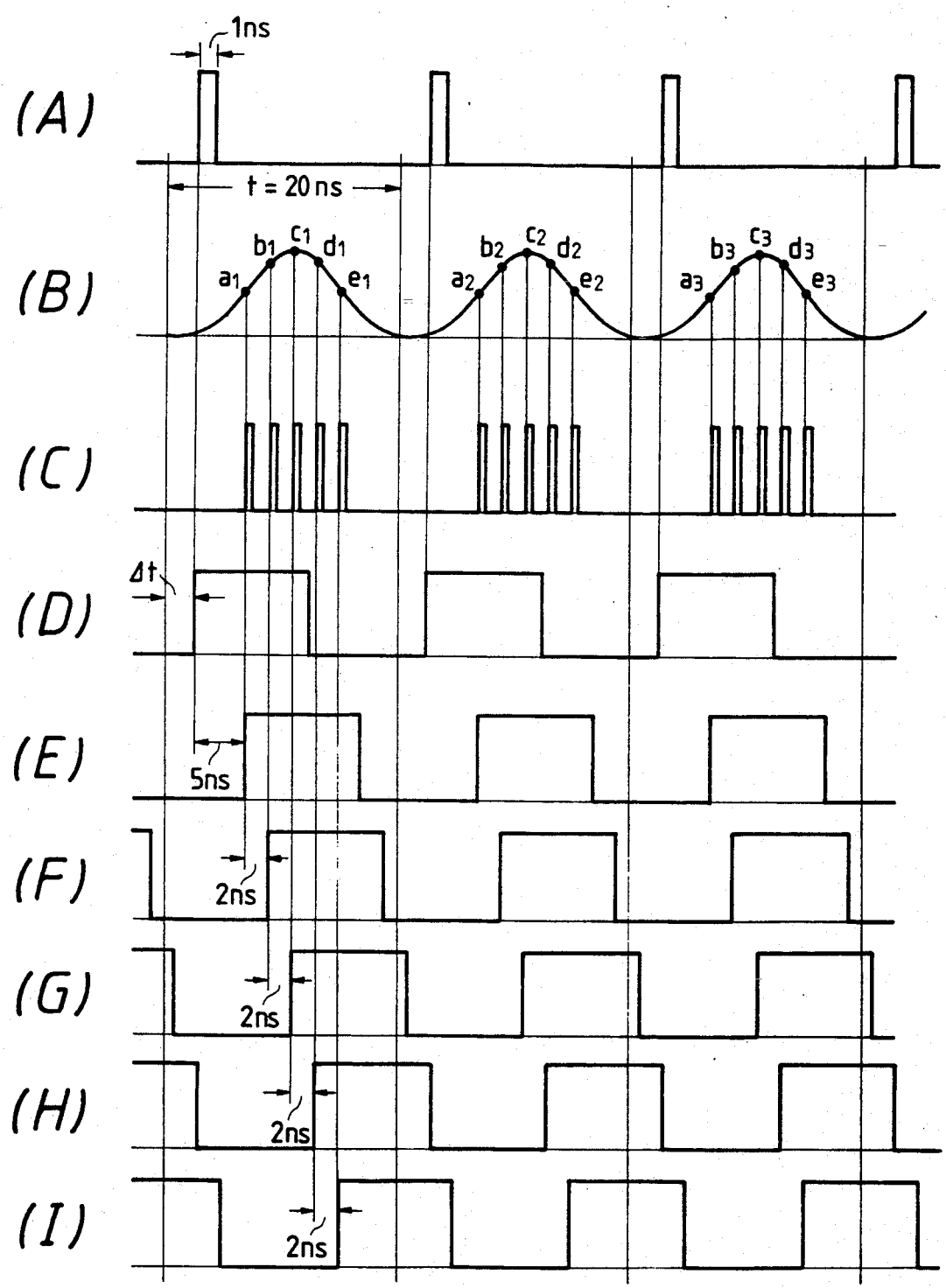
FIG. 2 is a signal waveform diagrams illustrating the timing between operating signals of each part of the device so as to explain a sampling method of detected signals according to the present invention.

FIG. 2 shows sampling timing of each sampling circuit of the sampling device 26, using a detected signal which is supplied from the secondary electron (or reflected electron) detector 9. When the operating frequency (clock frequency) is 50 MHz, a pulsed primary electron beam having a pulse width of 1 ns, for example, irradiates a specimen 10 (LSI) with a period of 20 ns (waveform (A) in FIG. 2). The detected signal supplied from the detector 9, is output usually as a pulse signal having a half-width value of 10 ns or so (refer to waveform (B) of the same figure). In this embodiment, signal values of five different positions (a1 to e1), each having 2 ns width in the predetermined range (including a peak value) of the detected pulse signal, are sampled by using five sampling circuits (high-speed AD converter).

A sampling and timing signal to give the timing of the sampling (refer to waveform (C) of the same figure), is provided to sample values of five positions having 2 ns width each in the range including the peak value of the detected pulse signal; therefore, in the setting circuit 25, a predetermined delay time is given, again, to the clock signal (refer to waveform (D) of the same figure) which has once been delayed through a delay circuit 5 (delay time is $\Delta t$) so as to make five delayed clock signals (refer to waveforms (E) to (I) in the same figure), and then each rising edge of the delayed clock signals is used.

As for the example shown in FIG. 2, a sampling circuit S3 is controlled to open and close by means of the third (central) sampling and timing signal which is generated by using the rising edge of a delayed clock signal shown by the waveform (G); and, the sampling circuit S3 samples a peak value (value at the position of c1) of the detected pulse signal. However, one of a plurality of sampling points, is not always requested to coincide with the position of the peak value.

Five detected signal values which are sampled one by one using each sampling circuit in the sampling apparatus 26, are stored, respectively, into each of five line memories M1 to M5 in a line memory apparatus 23 which is connected with an output stage of the sampling apparatus 26. Detected signal values which are sampled in the same clock period, are registered, respectively, into the corresponding channel of each line memory, and, in the next clock period, the sampled and detected signal values are registered, respectively, into the next corresponding channels.

In order to measure the whole aspect of one period of the internal operating signal waveform of the specimen (LSI), irradiating timing of the primary electron beam 2 is made to change little by little as a step function. This is done by changing the delay time $\Delta t$ of the changeable delay circuit 5 little by little, and step by step, every two or more clock cycles (in the example of the figure, 4K clock cycles). In this manner, a detected signal value is determined for a different phase point in the period (T) of the internal operating signal waveform to be measured, and measuring information is obtained for the whole of the internal operating signal waveform to be measured. This has already been described.

Here, if the number of channels of each line memory in the line memory apparatus 23 is set to 128K for example, the line memory apparatus 23 has the capacity to be able to store the total 32 phase points for every 4K clock cycles of information (detected signal value) which corresponds to one phase point of the internal operating signal waveform to be measured. By further increasing the number of channels of each line memory in the line memory apparatus 23, it is possible to increase the number of phase points which can be recorded, or the number of clock cycles which can be recorded for each phase point. However, even if the internal operating signal waveform of the specimen (LSI) to be measured is very complicated and has a very long period, it is sufficient to have storing capacity of a total of 32 phase points for every 4K clock cycles of each phase point, and therefore almost all kinds of measurement and analysis can be done for the internal operating signal waveform.

Figure 3:
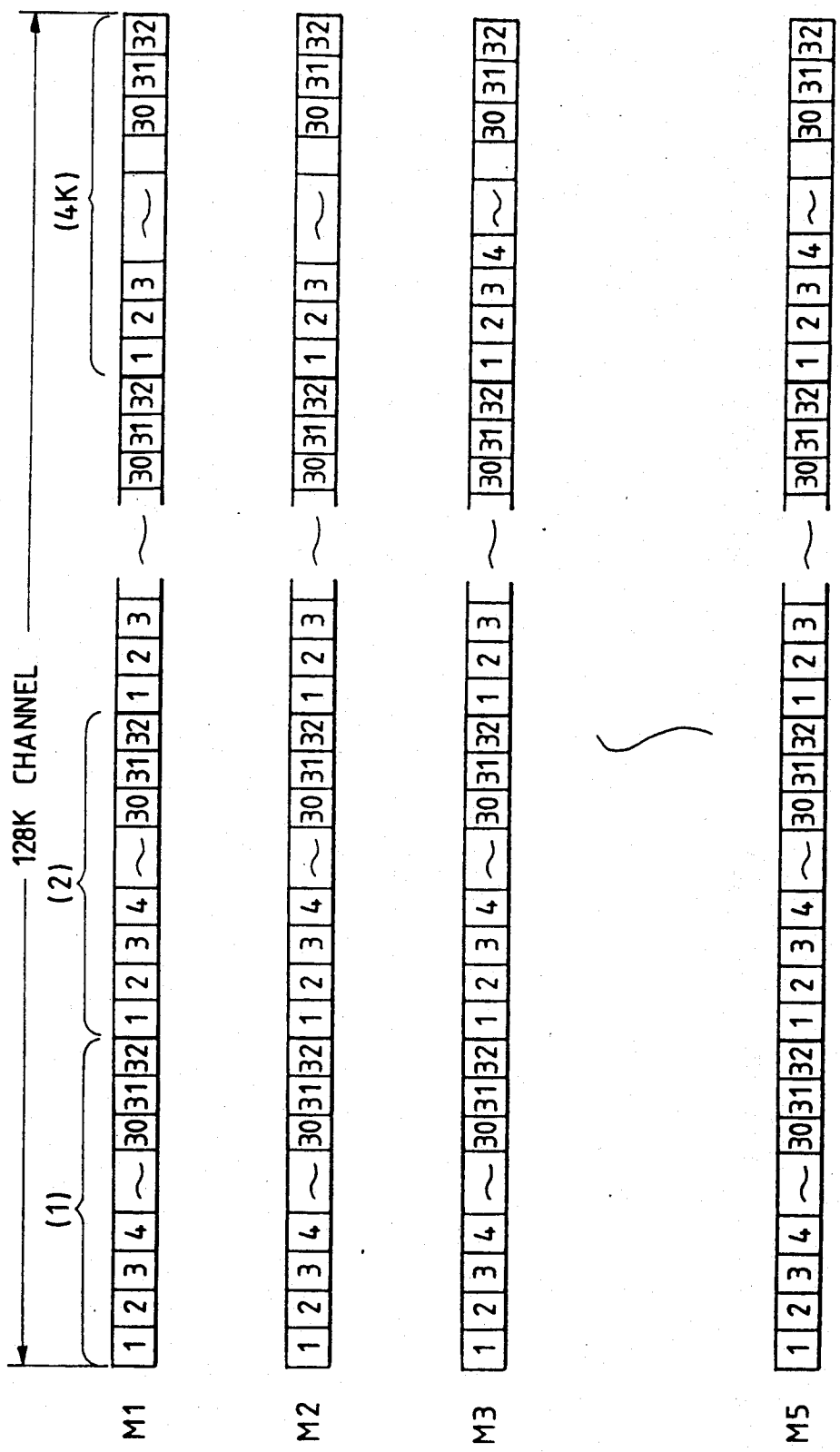
FIG. 3 shows a method of storing a sampled and detected signal into memory according to the present invention.

FIG. 3 shows a method to store a sampled and detected signal value into each line memory, and a method to read out detected signal data which have been stored in the line memory. In FIG. 3, a sampling value which is sampled by a first sampling circuit S1 of the sampling apparatus 26, is stored into the first line memory M1: in this case, a sampling value (at point a1) of the first clock cycle is stored into a channel (1)-1 of the line memory M1, and a sampling value (at point a2) of the second clock cycle is stored into a channel (2)-1 of the line memory M1. This is the same for other clock cycles: a sampling value (at point $a_N$) of the Nth clock cycle is stored into a channel (N)-1 of the line memroy M1, and, a sampling value (at point $a_{4K}$) of the 4Kth clock cycle is stored into a channel (4K)-1 of the line memory M1. In the same way, sampling values (b1, b2, ...) of the second sampling S2 are stored into a line memory M2, and, sampling values (e1, e2, ...) of the fifth sampling circuit S5 are stored into a line memory M5.

In this manner, detected signal data on a certain phase point of the internal operating signal waveform of a specimen to be measured (data through 4K clock cycles for five respective positions of detected signal pulses in each clock cycle) are stored; and, in the next place, the delay time $\Delta t$ generated from the changeable delay circuit 5 is made to change little by little, and step by step, so as to measure at another phase point, and thus the detected signal data are made to store in the same way as the previous description. For example, if we measure at 32 phase points in one clock period of the internal operating signal waveform of the specimen to be measured, the delay time $\Delta t$ of the changeable delay circuit 5 is made to change at the step of 0.625 ns, repeating the above described measurement on each phase point, and thus detected signal data of 1 to 32 phase points stored, respectively, into the corresponding channels 1 to 32 one after another. In order to improve the S/N ratio, measurement for each phase point is made through two or more clock cycles (4K clock cycles for an example shown in the figure); this has already been described in the previous section.

In this way, when measurement and storing of the detected signal data are completed for 32 phase points, the data stored in the line memory apparatus 23 are moved into a memory apparatus 24. The memory apparatus 24 is constructed, for example, with one line memory of 128K channels (capacity to be able to store data through 4K clock cycles for 32 phase points, respectively). And, into the memory apparatus 24, each sum of the stored data of the corresponding channel of five line memories M1 to M5 in the line memory apparatus 23, is registered. That is, data stored in the first channel (1)-1 of each of the line memories M1 to M5, are added to one another, and taken into the first channel of the memory apparatus 24; and, in the same manner, data stored in the second channel (1)-2 of each of the line memories M1 to M5, are added to one another, and taken into the second channel of the memory apparatus 24. Thus, adding to one another the stored data of each of the corresponding channels in each line memory and taking them into the memory apparatus 24, it will include detected signal data of improved S/N ratio. Moreover, by using the data stored in the memory apparatus 24, an operating signal waveform in the specimen can be displayed on a displaying apparatus 7.

By the way, when data are taken into the memory apparatus 24, data of each line memory are read out simultaneously in parallel, and then they might be added to one another; or, after the data of each line memory are sequentially read out one by one, they can be added and processed.

In the above embodiment, values of five positions on a detected signal pulse, which is obtained in every clock cycle, are sampled; but, as for the number of positions, three is possible, and thus at least two positions are possible. After all, two or more positions are possible in a range which includes a peak value of the detected signal pulse. And the two or more sampling positions are desirable to be distributed, per capita rate, in front of and behind the center, namely the above described peak value position. When the number of sampling positions is five, one sampling position is selected on the peak value position or its vicinity, and then two sampling positions are selected, respectively, before and after the peak value position, as is shown in the embodiment; and, it is suitable to set the time interval between each sampling position to 2 ns or so. When, on the other hand, the number of sampling positions is three, one sampling position is selected on the peak value position or its vicinity, and then each sampling position is distributed, in front of and behind the peak value position; and, it is suitable to set the time interval between each sampling position to 5 ns or so.

If the number of sampling positions and/or the time interval between each sampling position, can be changed depending on the clock frequency (that is, pulse interval between detected signal pulses), it is more practical. For example, adjustment of the number of sampling positions should be decreased when the pulse interval of the detected signal pulses is small, and, on the other hand, when the pulse interval of the detected signal pulses is large, the number of the sampling positions should be increased. Further adjustment of the sampling time interval should be short when the pulse interval of the detected signal pulses is small, and when the pulse interval of the detected signal pulse is large, the sampling time interval should be long. In this way, even if the pulse interval of the detected signal pulse becomes short, the sampling interval can be selected so as to keep sufficiently the response characterisitcs for sampling the detected signal pulses, and, the number of sampling points can be selected so as to improve sufficiently the accuracy of measurement.

Furthermore, the inventive device can be so constructed that the number of sampling points can be changed depending on the pulse width of a pulsed, primary electron beam which will irradiate the specimen. That is, when the pulse width of the primary electron beam becomes long, it is natural that the pulse width of the detected signal pulses will be long. And, if the pulse width of the detected signal pulses becomes long, the number of sampling points can be increased as much. Therefore, when the pulse width of the primary electron beam is long, the number of sampling points is increased; and, on the other hand, when the pulse width of the primary electron beam is short, the number of sampling points is decreased. In such a construction of the inventive device, the S/N ratio of the detected data can be improved more and more, even if the pulse width of the primary electron beam is long. Moreover, in the above described embodiment, sampling values of two or more positions of the detected signal pulse are added to one another so as to obtain measured data; but, from sampling values of two or more positions, their averaged value may be calculated and used as measured data.

It is apparent from the above description that, in a charged particle beam device according to the present invention, which will obtain measuring information about a specimen by irradiating the specimen with a primary, pulsed beam of charged particles, and by detecting a secondary beam of charged particles (electrons, reflected electrons and so on) which are emitted from the specimen, using a detector; an amplitude of a detected signal pulse which has a short pulse-width and a short pulse interval, can be measured with high accuracy and great efficiency. Therefore, according to the present invention, when an internal operating signal of a specimen, for example a logic LSI, is measured or analyzed logically by using the previously described charged particle beam device, great effects are obtained for reducing the measuring time, and for improving the accuracy of measurment.

What is claimed is:

1. A charged particle beam device for measuring an internal signal waveform of a semiconductor device, comprising:
    a means for irradiating a surface of a specimen with a primary, charged particle beam os pulse form, in synchronism with a clock signal, once in each clock period; said clock signal determining an operating period of an internal operating signal of said specimen,
    a means for detecting a secondary electron or a reflected electron, said secondary electron or said reflected electron being emitted from said surface of said specimen by irradiating said surface with said primary, charged particle beam of pulse form,
    a means for sampling values of a detection signal pulse generated by said detecting means, the sampled values corresponding to a plurality of positions in a range of each detection signal pulse including a peak value of the detected signal pulse, said pulse being generated by said detecting means once in each period of said clock signal, and p1 a means for forming data corresponding to a sum calculated from sampling values of said plurality of positions.

2. A charged particle beam device according to claim 1, further comprising a displaying means for displaying an internal operating signal waveform of said specimen by using data corresponding to said sum calculated from sampling values of a plurality of said positions.

3. A charged particle beam device according to claim 1, further comprising a means for changing a number of sampling positions depending on a pulse interval of said detected signal pulse, said number of sampling positions being used when sampling said values of a plurality of positions on said detected signal pulse, by using said sampling means.

4. A charged particle beam device according to claim 1, further comprising a means for changing a sampling time interval depending on a pulse interval of said detected signal pulse, said sampling time interval being used when sampling said values of a plurality of positions on said detected signal pulse, by using said sampling means.

5. A charged particle beam device according to claim 2, further comprising a means for changing a number of sampling positions depending on a pulse interval of said detected signal pulse, said number of sampling positions being used when sampling said values of a plurality of positions on said detected signal pulse, by using said sampling means.

6. A charged particle beam device according to claim 2, further comprising a means for changing a sampling time interval depending on a pulse interval of said detected signal pulse, said sampling time interval being used when sampling said values of a plurality of positions on said detected signal pulse, by using said sampling means.

7. A charge particle beam device according to claim 1, further comprising a means for changing a number of sampling positions depending on an irradiating pulse width of said pulsed, primary charged particle beam; said sampling positions being used when sampling said values of a plurality of positions on said detected signal pulse, by using said sampling means.

8. A charged particle beam device according to claim 1, wherein the number of positions for sampling said detected signal pulse by using said sampling means is five, and a time interval between each sampling position is 2 ns.

9. A charged particle beam device according to claim 1, wherein the number of sampling positions for sampling said detected signal pulse by using said sampling means is three, and a time interval between each sampling position is 5 ns.

10. A charged particle beam device according to claim 3, further comprising a means for changing a sampling time interval depending on a pulse interval of said detected signal pulse, said sampling time interval being used when sampling said values of a plurality of positions on said detected signal pulse, by using said sampling means.

11. A charged particle beam device according to claim 5, further comprising a means for changing a sampling time interval depending on a pulse interval of said detected signal pulse, said sampling time interval being used when sampling said values of a plurality of positions on said detected signal pulse, by using said sampling means.

12. A charge particle beam device according to claim 2, further comprising a means for changing a number of sampling positions depending on an irradiating pulse width of said pulsed, primary charged particle beam; said sampling positions being used when sampling said values of a plurality of positions on said detected signal pulse, by using said sampling means.

13. A charge particle beam device according to claim 2, wherein the number of positions for sampling said detected signal pulse by using said sampling means is five, and a time interval between each sampling position is 2 ns.

14. A charged particle beam device according to claim 2, wherein the number of sampling positions for sampling said detected signal pulse by using said sampling means is three, and a time interval between each sampling position is 5 ns.

15. A charge particle beam device for measuring an internal signal waveform of a semiconductor device, comprising:
 a means for irradiating a surface of a specimen with a primary, charged particle beam of pulse form, in synchronism with a clock signal, once in each clock period; said clock signal determining an operating period of an internal operating signal of said specimen,
 a means for detecting a secondary electron or a reflected electron, said secondary electron or said reflected electron being emitted from said surface of said specimen by irradiating said surface with said primary, charged particle beam of pulse form,
 a means for sampling values of a detection signal pulse generated by said detecting means, the sampled values corresponding to a plurality of positions in a range of each detection signal pulse including a peak value of the detected signal pulse, said pulse being generated by said detecting means once in each period of said clock signal, and
 a means for forming data corresponding to an averaged value calculated from sampling values of said plurality of positions.

16. A charged particle beam device according to claim 15, further comprising a displaying means for displaying an internal operating signal waveform of said specimen by using data corresponding to said averaged value calculated from sampling values of a plurality of said positions.

17. A charge particle beam device according to claim 15, further comprising a means for changing a number of sampling positions depending on a pulse interval of said detected signal pulse, said number of sampling positions being used when sampling said values of a plurality of positions on said detected signal pulse, by using said sampling means.

18. A charge particle beam davice according to claim 15, further comprising a means for changing a sampling time interval depending on a pulse interval of said detected signal pulse, said sampling time interval being used when sampling said values of a plurality of positions on said detected signal pulse, by using said sampling means.

19. A charge particle beam device according to claim 16, further comprising a means for changing a number of sampling positions depending on a pulse interval of said detected signal pulse, said number of sampling positions being used when sampling said values of a plurality of positions on said detected signal pulse, by using said sampling means.

20. A charge particle beam device according to claim 16, further comprising a means for changing a sampling time interval depending on a pulse interval of said detected signal pulse, said sampling time interval being used when sampling said values of a plurality of positions on said detected signal pulse, by using said sampling means.

21. A charged particle beam device according to claim 15, further comprising a means for changing a number of sampling positions depending on an irradiating pulse width of said pulsed, primary charged particle beam; said sampling positions being used when sampling said values of a plurality of positions on said detected signal pulse, by using said sampling means.

22. A charged particle beam device according to claim 15, wherein the number of positions for sampling said detected signal pulse by using said sampling means is five, and a time interval between each sampling position is 2 ns.

23. A charged particle beam device according to claim 15, wherein the number of sampling positions for sampling said detected signal pulse by using said sampling means is three, and a time interval between each sampling position is 5 ns.

24. A charged particle beam device according to claim 17, further comprising a means for changing a sampling time interval depending on a pulse interval of said detected signal pulse, said sampling time interval being used when sampling said values of a plurality of positions on said detected signal pulse, by using said sampling means.

25. A charged particle beam device according to claim 19, further comprising a means for changing a sampling time interval depending on a pulse interval of said detected signal pulse, said sampling time interval being used when sampling said values of a plurality of positions on said detected signal pulse, by using said sampling means.

26. A charged particle beam device according to claim 16, further comprising a means for changing a number of sampling positions depending on an irradiating pulse width of said pulsed, primary charged particle beam; said sampling positions being used when sampling said values of a plurality of positions on said detected signal pulse, by using said sampling means.

27. A charged particle beam device according to claim 16, wherein the number of positions for sampling said detected signal pulse by using said sampling means is five, and a time interval between each sampling position is 2 ns.

28. A charged particle beam device according to claim 16, wherein the number of sampling positions for sampling said detected signal pulse by using said sampling means is three, and a time interval between each sampling position is 5 ns.

* * * * *